United States Patent
Kamei et al.

(10) Patent No.: US 8,049,111 B2
(45) Date of Patent: Nov. 1, 2011

(54) PRINTED CIRCUIT BOARD AND METHOD OF MANUFACTURING THE SAME

(75) Inventors: Katsutoshi Kamei, Ibaraki (JP); Voonyee Ho, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 388 days.

(21) Appl. No.: 12/485,091

(22) Filed: Jun. 16, 2009

(65) Prior Publication Data

US 2009/0316300 A1 Dec. 24, 2009

Related U.S. Application Data (60) Provisional application No. 61/078,485, filed on Jul. 7, 2008.

(30) Foreign Application Priority Data

Jun. 20, 2008 (JP) .................................. 2008-161599

(51) Int. Cl.
*H05K 1/00* (2006.01)
(52) U.S. Cl. ....................................... 174/250; 174/257
(58) Field of Classification Search .................. 174/250, 174/254, 257, 260, 261; 361/760; 360/245.9; 29/846

See application file for complete search history.

(56) References Cited

U.S. PATENT DOCUMENTS

| 5,717,547 | A | 2/1998 | Young |
| 5,995,328 | A | 11/1999 | Balakrishnan |
| 6,894,874 | B2 * | 5/2005 | Maruyama et al. ........ 360/245.9 |
| 6,900,967 | B1 | 5/2005 | Coon et al. |
| 7,142,395 | B2 * | 11/2006 | Swanson et al. ........... 360/245.9 |
| 2008/0000673 | A1 * | 1/2008 | Ishii et al. ..................... 174/250 |
| 2010/0000774 | A1 * | 1/2010 | Naito et al. ................... 174/260 |

FOREIGN PATENT DOCUMENTS

JP 2006-042098 A 2/2006

* cited by examiner

*Primary Examiner* — Yuriy Semenenko (74) *Attorney, Agent, or Firm* — Panitch Schwarze Belisario & Nadel LLP (57) ABSTRACT

A first insulating layer is formed on a suspension body. Wiring traces are formed in parallel at an interval on the first insulating layer. A second insulating layer is formed in a region on the first insulating layer on both sides of the wiring traces. A wiring trace is formed in a region on the second insulating layer on the side of the wiring trace. A wiring trace is formed in a region on the second insulating layer on the side of the wiring trace. A third insulating layer is formed on the first and second insulating layers to cover the wiring traces.

7 Claims, 8 Drawing Sheets

PRINTED CIRCUIT BOARD AND METHOD OF MANUFACTURING THE SAME

BACKGROUND OF THE INVENTION

1. Field of the Invention

The present invention relates to a printed circuit board and a method of manufacturing the same.

2. Description of the Background Art

An actuator is used in a drive such as a hard disk drive. Such an actuator includes an arm arranged rotatably with respect to a rotation shaft and a suspension board used for a magnetic head that is attached to the arm. The suspension board is a printed circuit board for positioning the magnetic head with a desired track of a magnetic disk.

The printed circuit board used as the suspension board includes a signal line pair composed of two wiring traces, for example. JP 2006-42098 A describes a high frequency printed circuit board with differential signal lines composed of two signal lines in parallel with an upper surface of a dielectric substrate formed thereon.

In recent years, lower transmission loss in the suspension board has been desired for lower power consumption of electronic equipment. The signal line pair formed in the same plane as described above increases the transmission loss.

SUMMARY OF THE INVENTION

An object of the present invention is to provide a printed circuit board capable of reducing transmission loss and a method of manufacturing the same.

(1) According to an aspect of the present invention, a printed circuit board includes an insulating layer, first and second wiring traces formed with a first height on the insulating layer, and third and fourth wiring traces formed with a second height different from the first height on the insulating layer inside the first and second wiring traces, wherein the first and third wiring traces are arranged to be adjacent to each other and constitute a first signal line pair, and the second and fourth wiring traces are arranged to be adjacent to each other and constitute a second signal line pair.

In the printed circuit board, the first and second wiring traces are formed with the first height, and the third and fourth wiring traces are formed with the second height inside the first and second wiring traces. Thus, the first and third wiring traces that are adjacent to each other to constitute the first signal line pair have the different heights, and the second and fourth wiring traces that are adjacent to each other to constitute the second signal line pair have the different heights.

Such a configuration reduces transmission loss caused by proximity effects at the time of input of a differential signal to the first and second signal line pairs. In addition, an elapsed time from a rise of an input voltage to a rise of an output voltage can be shortened at the time of input of the differential signal.

(2) An interval between the first and third wiring traces and an interval between the second and fourth wiring traces may be equal to each other.

In this case, the transmission loss caused by proximity effects can be sufficiently reduced at the time of input of the differential signal to the first and second signal line pairs. In addition, the elapsed time from the rise of the input voltage to the rise of the output voltage can be sufficiently shortened at the time of input of the differential signal.

(3) One of the first and third wiring traces and one of the second and fourth wiring traces may be connected to each other, and the other of the first and third wiring traces and the other of the second and fourth wiring traces may be connected to each other. In this case, a common differential signal can be input to the first and second signal line pairs.

(4) The first height may be higher than the second height. In this case, the transmission loss caused by proximity effects can be sufficiently reduced while the elapsed time from the rise of the input voltage to the rise of the output voltage can be sufficiently shortened.

(5) The first height may be lower than the second height. In this case, the transmission loss caused by proximity effects can be sufficiently reduced while the elapsed time from the rise of the input voltage to the rise of the output voltage can be sufficiently shortened.

(6) The printed circuit board may further include a long-sized metal substrate, and a head provided on the metal substrate for reading and writing signals, wherein the insulating layer may be formed on the metal substrate, and the first, second, third and fourth wiring traces may be electrically connected to the head.

In this case, the printed circuit board can be used as a suspension board of a drive such as a hard disk drive, and information can be written or read in and from a magnetic disk by the first and third wiring traces constituting the first signal line pair and the second and fourth wiring traces constituting the second signal line pair. In addition, the transmission loss caused by proximity effects is reduced, thus reducing power consumption of the drive. Furthermore, the elapsed time from the rise of the input voltage to the rise of the output voltage can be sufficiently shortened, so that the drive can be smoothly operated.

(7) According to another aspect of the present invention, a method of manufacturing a printed circuit board includes the steps of forming first and second wiring traces with a first height on an insulating layer, and forming third and fourth wiring traces with a second height different from the first height on the insulating layer inside the first and second wiring traces, wherein the first and third wiring traces are arranged to be adjacent to each other and constitute a first signal line pair, and the second and fourth wiring traces are arranged to be adjacent to each other and constitute a second signal line pair.

In the method of manufacturing the printed circuit board, the first and second wiring traces are formed with the first height, and the third and fourth wiring traces are formed with the second height inside the first and second wiring traces. Thus, the first and third wiring traces that are adjacent to each other to constitute the first signal line pair have the different heights, and the second and fourth wiring traces that are adjacent to each other to constitute the second signal line pair have the different heights.

This reduces transmission loss caused by proximity effects at the time of input of a differential signal to the first and second signal line pairs. In addition, an elapsed time from a rise of an input voltage to a rise of an output voltage can be shortened at the time of input of the differential signal.

According to the present invention, the transmission loss caused by proximity effects can be reduced at the time of input of the differential signal to the first and second signal line pairs. In addition, the elapsed time from the rise of the input voltage to the rise of the output voltage can be shortened at the time of input of the differential signal.

Other features, elements, characteristics, and advantages of the present invention will become more apparent from the following description of preferred embodiments of the present invention with reference to the attached drawings.

DESCRIPTION OF THE PREFERRED EMBODIMENTS

Hereinafter, description is made of a printed circuit board and a method of manufacturing the same according to embodiments of the present invention while referring to the drawings. As the printed circuit board according to the embodiments of the present invention, the configuration and manufacturing method of a suspension board used for an actuator of a hard disk drive will be described.

(1) Configuration of the Suspension Board

Figure 1:
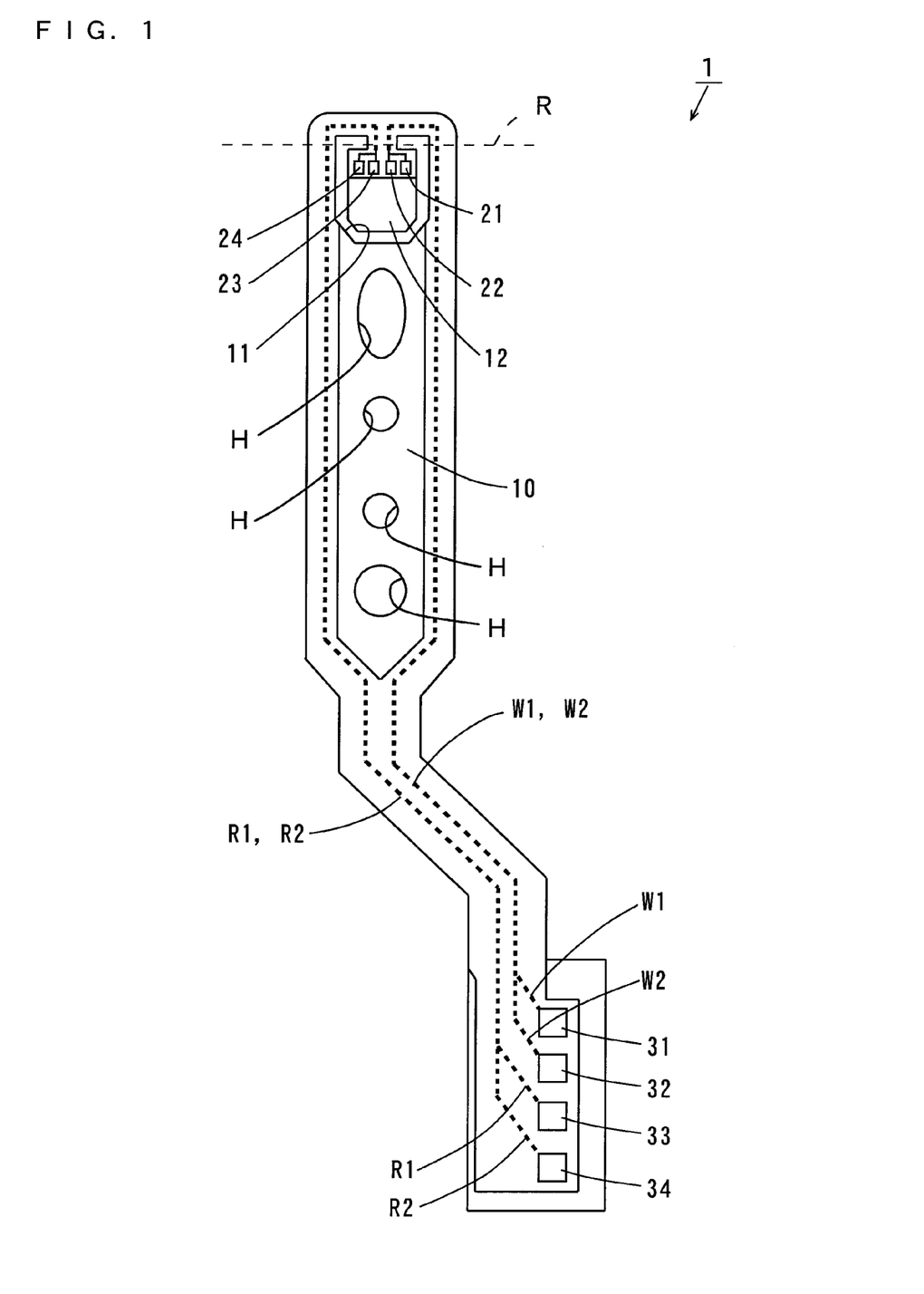
FIG. 1 is a plan view of a suspension board according to a first embodiment.

FIG. 1 is a top view of the suspension board according to one embodiment of the present invention. As shown in FIG. 1, the suspension board 1 includes a suspension body 10 formed of a long-sized metal substrate. Write wiring patterns W1, W2 and read wiring patterns R1, R2 are formed on the suspension body 10, as indicated by the bold dotted lines.

At an end of the suspension body 10, a U-shaped opening 11 is formed, thereby providing a magnetic head supporting portion (hereinafter referred to as a tongue) 12. The tongue 12 is bent along the broken line R to form a predetermined angle with respect to the suspension body 10. Four electrode pads 21, 22, 23, 24 are formed at an end of the tongue 12.

Four electrode pads 31, 32, 33, 34 are formed at the other end of the suspension body 10. The electrode pads 21 to 24 on the tongue 12 and the electrode pads 31 to 34 at the other end of the suspension body 10 are electrically connected to one another through the wiring patterns W1, W2, R1, R2, respectively. A plurality of holes H are formed in the suspension body 10.

In the hard disk drive (not shown) including the suspension board 1, a current flows through the pair of write wiring patterns W1, W2 at the time of writing information in the magnetic 40 disk. In addition, a current flows through the pair of read wiring patterns R1, R2 at the time of reading information from the magnetic disk.

Figure 2:
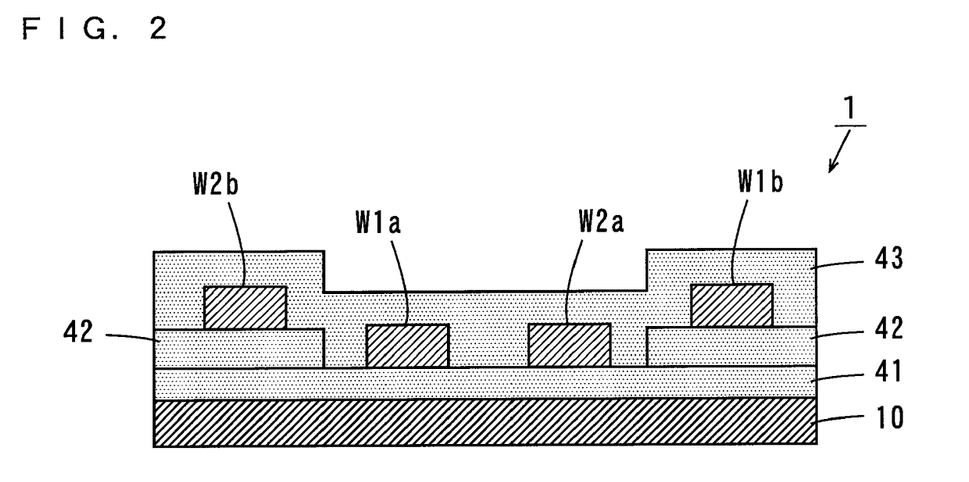
FIG. 2 is a schematic vertical sectional view of write wiring traces of the suspension board and periphery thereof according to the first embodiment.

Next, detail description is made of the write wiring patterns W1, W2 of the suspension board 1 and periphery thereof. FIG. 2 is a schematic vertical sectional view of the write wiring patterns W1, W2 of the suspension board 1 of FIG. 1 and the periphery thereof.

As shown in FIG. 2, a first insulating layer 41 is formed on the suspension body 10. Wiring traces W1a, W2a are formed in parallel at an interval from each other on the first insulating layer 41. A second insulating layer 42 is formed in a region on both sides of the wiring traces W1a, W2a on the first insulating layer 41.

A wiring trace W2b is formed in a region on the second insulating layer 42 on the side of the wiring trace W1a. A wiring trace W1b is formed in a region on the second insu-lating layer 42 on the side of the wiring trace W2a. A third insulating layer 43 is formed on the first and second insulating layers 41, 42 to cover the wiring traces W1a, W2a, W1b, W2b.

In this manner, the wiring traces W1a, W2a are formed in positions lower than the wiring traces W1b, W2b inside the wiring traces W1b, W2b.

The wiring traces W1a, W1b are connected to each other at predetermined portions, and the wiring traces W2a, W2b are connected to each other at predetermined portions. In the present embodiment, the wiring traces W1a, W1b constitute the write wiring pattern W1, and the wiring traces W2a, W2b constitute the write wiring pattern W2. The write wiring pattern W1 and the write wiring pattern W2 constitute one signal line pair.

(2) Method of Manufacturing the Suspension Board

The method of manufacturing the suspension board 1 is described. Here, description of respective steps of forming the tongue 12, the electrode pads 21 to 24, 31 to 34, the holes H and the read wiring patterns R1, R2 of FIG. 1 is omitted.

Figure 3:
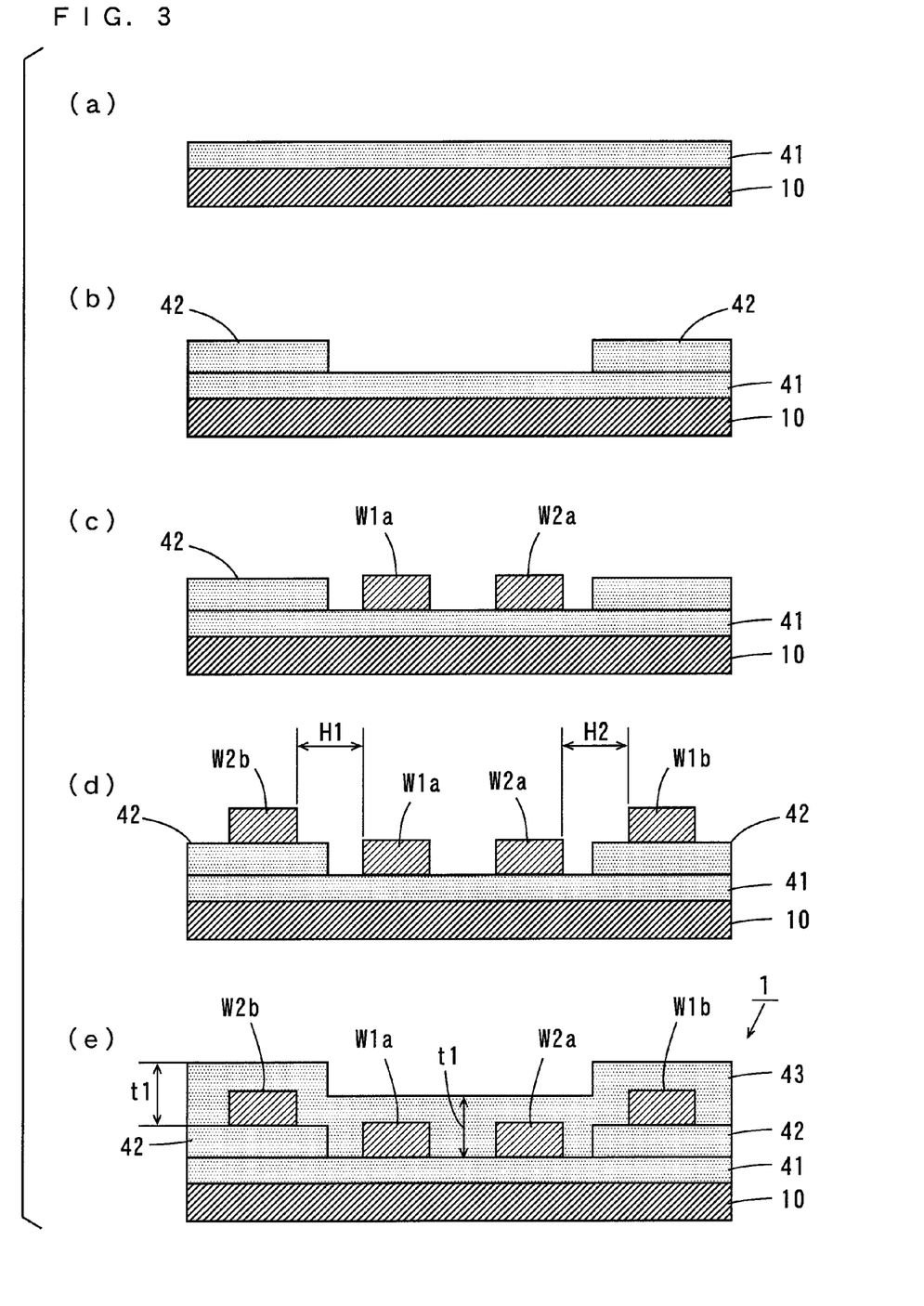
FIG. 3 is a diagram showing steps of manufacturing the suspension board according to the first embodiment.

FIG. 3 is a vertical sectional view showing steps of manufacturing the suspension board 1 according to the one embodiment of the present invention.

First, a long-sized substrate made of stainless steel (SUS), for example, is prepared as the suspension body 10. Then, the first insulating layer 41 made of polyimide, for example, is formed on the suspension body 10 as shown in FIG. 3(a).

Another material such as Aluminum (Al) instead of stainless steel may be used as the suspension body 10. The thickness of the suspension body 10 is not less than 5 μm and not more than 50 μm, for example, and preferably not less than 10 μm and not more than 30 μm.

Another insulating material such as epoxy resin instead of polyimide may be used as the first insulating layer 41. The thickness of the first insulating layer 41 is not less than 3 μm and not more than 20 μm, for example, and preferably not less than 5 μm and not more than 15 μm.

Then, the second insulating layer 42 made of polyimide, for example, is formed in the predetermined region on the first insulating layer 41 as shown in FIG. 3(b).

Another insulating material such as epoxy resin instead of polyimide may be used as the second insulating layer 42. The thickness of the second insulating layer 42 is not less than 3 μm and not more than 20 μm, for example, and preferably not less than 5 μm and not more than 15 μm.

As shown in FIG. 3(c), the wiring traces W1a, W2a made of copper (Cu), for example, are subsequently formed in a region on the first insulating layer 41. The second insulating layer 42 is positioned on both sides of the foregoing region. Next, the wiring traces W1b, W2b made of copper, for example, are formed on the second insulating layer 42 on the both sides of the wiring traces W1a, W2a as shown in FIG. 3(d).

The wiring traces W1a, W2a, W1b, W2b may be formed using a semi-additive method, for example, or another method such as a subtractive method. The wiring traces W1a, W2a, W1b, W2b can be formed using another metal such as gold (Au) and aluminum or an alloy such as a copper alloy and an aluminum alloy, not limited to copper.

The thickness of each of the wiring traces W1a, W2a is not less than 3 μm and not more than 16 μm, for example, and preferably not less than 6 μm and not more than 13 μm. The width of each of the wiring traces W1a, W2a is not less than 5 μm and not more than 30 μm, for example, and preferably not less than 10 μm and not more than 25 μm.

The thickness of each of the wiring traces W1b, W2b is not less than 3 μm and not more than 16 μm, for example, and preferably not less than 6 μm and not more than 13 μm. The width of each of the wiring traces W1b, W2b is not less than 5 μm and not more than 30 μm, for example, and preferably not less than 10 μm and not more than 25 μm.

An interval H1 between the wiring traces W2b, W1a in a direction parallel to an upper surface of the first insulating layer 41 is not less than 5 μm and not more than 50 μm, for example, and preferably not less than 10 μm and not more than 20 μm. An interval between the wiring traces W1a, W2a is not less than 5 μm and not more than 50 μm, for example, and preferably not less than 10 μm and not more than 20 μm. An interval H2 between the wiring traces W2a, W1b in the direction parallel to the upper surface of the first insulating layer 41 is not less than 5 μm and not more than 50 μm, for example, and preferably not less than 10 μm and not more than 20 μm.

Note that thin metal films may be formed between the first insulating layer 41 and the wiring traces W1a, W2a, respectively, and between the second insulating layer 42 and the wiring traces W1b, W2b, respectively. In this case, adhesion between the first insulating layer 41 and the wiring traces W1a, W2a and between the second insulating layer 42 and the wiring traces W1b, W2b is improved.

Then, the third insulating layer 43 made of polyimide, for example, is formed on the first and second insulating layers 41, 42 to cover the wiring traces W1a, W2a, W1b, W2b as shown in FIG. 3(e).

Another insulating material such as epoxy resin instead of polyimide may be used as the third insulating layer 43. The thickness t1 of the third insulating layer 43 is not less than 1 μm and not more than 30 μm, for example, and preferably not less than 3 μm and not more than 10 μm.

In this manner, the suspension board 1 shown in FIGS. 1 and 2 is completed.

(3) Effects

When a differential signal is transmitted through the write wiring pattern W1 (the wiring traces W1a, W1b) and the write wiring pattern W2 (the wiring traces W2a, W2b), transmission loss due to proximity effects increases as decreasing the distance between the wiring traces W1a, W2b and the distance between the wiring traces W1b, W2a in a high frequency region.

Therefore, the wiring traces W1a, W2a are formed in the positions lower than the wiring traces W1b, W2b inside the wiring traces W1b, W2b in the present embodiment. In this case, the distance between the wiring traces W1a, W2b and the distance between the wiring traces W1b, W2a are longer than those when the wiring traces W1a, W2a, W1b, W2b are formed in the same plane. This reduces the transmission loss of the wiring traces W1a, W2a, W1b, W2b.

When the differential signal is input, a time period from a rise of an input voltage to a rise of an output voltage (hereinafter referred to as an input/output elapsed time) becomes longer as increasing capacitances of the wiring traces W1a, W2a, W1b, W2b. The capacitances of the wiring traces W1a, W2a, W1b, W2b are increased as decreasing the distances between the adjacent wiring traces.

As described above, in the present embodiment, the distance between the wiring traces W1a, W2b and the distance between the wiring traces W1b, W2a are longer than those when the wiring traces W1a, W2a, W1b, W2b are formed in the same plane. This reduces the capacitances of the wiring traces W1a, W2a, W1b, W2b. Accordingly, the input/output elapsed time at the time of input of the differential signal is shortened.

Note that the capacitances of the wiring traces W1a, W2a, W1b, W2b can be further reduced by using a material having a low dielectric constant such as a liquid crystal polymer (LCP) as the second and third insulating layers 42, 43. This further reduces the transmission loss of the wiring traces W1a, W2a, W1b, W2b while further shortening the input/output elapsed time at the time of input of the differential signal.

(4) Other Embodiments

Suspension boards according to other embodiments of the present invention are described while referring to differences from the suspension board 1 shown in FIGS. 1 and 2.

Figure 4:
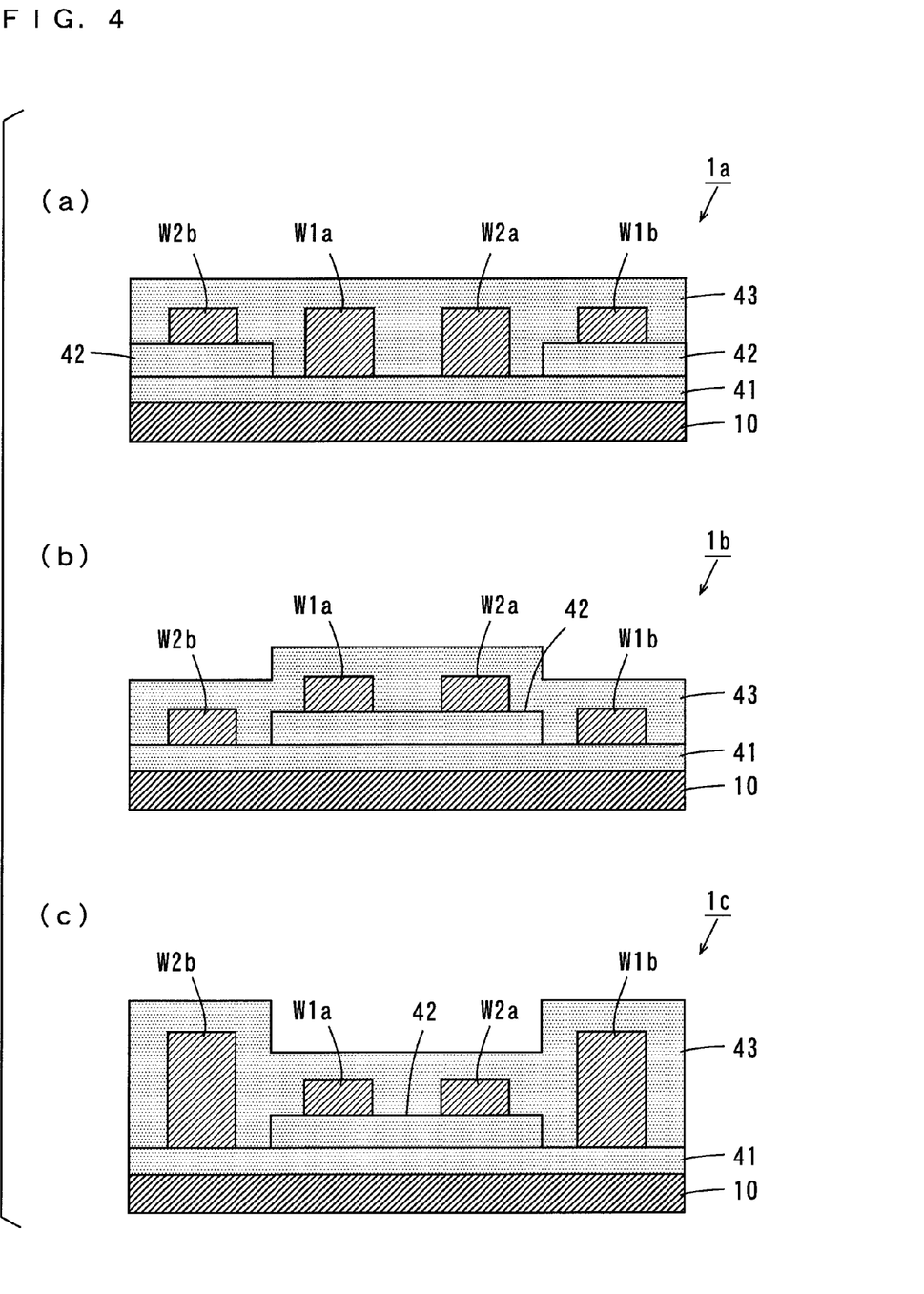
FIG. 4 shows schematic sectional views of suspension boards according to other embodiments.
Figure 5:
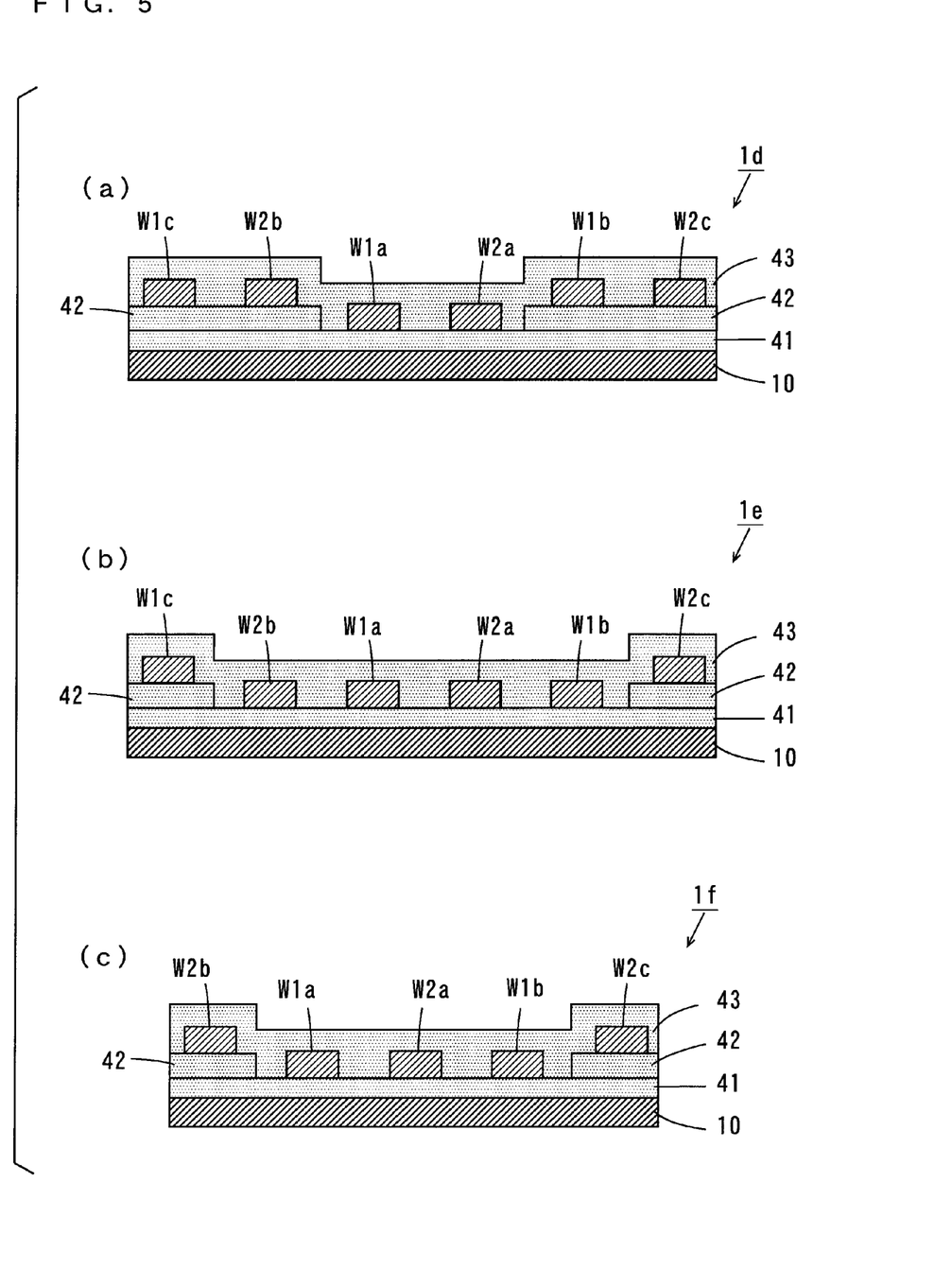
FIG. 5 shows schematic sectional views of suspension boards according to other embodiments.

FIGS. 4 and 5 show schematic sectional views of the suspension boards according to the other embodiments. Note that FIGS. 4 and 5 show write wiring traces of the suspension boards and periphery thereof.

In the suspension board 1a of FIG. 4(a), the thickness of each of the wiring traces W1a, W2a is larger than the thickness of each of the wiring traces W1b, W2b, and upper surfaces of the wiring traces W1a, W2a and upper surfaces of the wiring traces W1b, W2b are at substantially the same height.

In the suspension board 1b of FIG. 4(b), the wiring traces W1b, W2b are formed on the first insulating layer 41. The second insulating layer 42 is formed in a region on the first insulating layer 41 between the wiring traces W1b, W2b. The wiring traces W1a, W2a are formed on the second insulating layer 42.

The suspension board 1c of FIG. 4(c) is different from the suspension board 1b of FIG. 4(b) in that the thickness of each of the wiring traces W1b, W2b is larger than the thickness of each of the wiring traces W1a, W2a, and the upper surfaces of the wiring traces W1b, W2b are in positions higher than the upper surfaces of the wiring traces W1a, W2a.

The thicknesses of the wiring traces W1a, W2a and the thicknesses of the wiring traces W1b, W2b may be arbitrarily changed as in the examples shown in FIG. 4(a) to (c). Moreover, the wiring traces W1a, W2a may be provided on the second insulating layer 42 while the wiring traces W1b, W2b may be provided on the first insulating layer 41. Also in these cases, the transmission loss of the wiring traces W1a, W2a, W1b, W2b is reduced while the input/output elapsed time at the time of input of the differential signal is shortened.

In the suspension board 1d of FIG. 5(a), wiring traces W1c, W2c are formed in regions on the second insulating layer 42 outside the wiring traces W1b, W2b.

The wiring trace W1c is connected to the wiring traces W1a, W1b, thereby constituting the write wiring pattern W1. The wiring trace W2c is connected to the wiring traces W2a, W2b, thereby constituting the write wiring pattern W2. The wiring traces W1a, W1b, W1c of the write wiring pattern W1 and the wiring traces W2a, W2b, W2c of the write wiring pattern W2 are alternately arranged.

The suspension board 1e of FIG. 5(b) has the same configuration as the suspension board 1d of FIG. 5(a) except that the wiring traces W1b, W2b are formed on the first insulating layer 41.

In the suspension board 1f of FIG. 5(c), the wiring traces W1a, W2a, W1b are formed on the first insulating layer 41, and the wiring traces W2b, W2c are formed on the second insulating layer 42 on the both sides of the wiring traces W1a, W2a, W1b. The wiring traces W1a, W1b of the write wiring pattern W1 and the wiring traces W2a, W2b, W2c of the write wiring pattern W2 are alternately arranged.

The number of the wring traces constituting the write wiring patterns W1, W2 may be arbitrarily changed as in the examples shown in FIG. 5(a) to (c). Moreover, the number of the wiring traces formed on the first insulating layer 41 and the number of the wiring traces formed on the second insulating layer 42 may be arbitrarily changed. Also in these cases, the transmission loss of the write wiring patterns W1, W2 is reduced while the input/output elapsed time at the time of input of the differential signal is shortened.

Note that it is preferred that the wiring traces constituting the write wiring pattern W1 and the wiring traces constituting the write wiring pattern W2 are alternately arranged. In addition, the plurality of wiring traces are preferably arranged so as to be symmetric with respect to a plane that is along center lines of the wiring traces arranged at both ends (the wiring traces W2b, W2c in FIG. 5(c), for example), and is vertical to the upper surface of the first insulating layer 41.

(5) INVENTIVE EXAMPLE AND COMPARATIVE EXAMPLES

(5-1) Inventive Example

The suspension board 1 shown in FIG. 2 was manufactured as an inventive example. Note that the thickness of each of the wiring traces W1a, W2a, W1b, W2b was 10 μm, and the width of each of the wiring traces W1a, W2a, W1b, W2b was 20 μm.

The thickness of the first insulating layer 41 was 3 μm, the thickness of the second insulating layer 42 was 10 μm, and the thickness t1 (FIG. 3(e)) of the third insulating layer 43 was 15 μm. Each of the interval between the wiring traces W2b, W1a, the interval between the wiring traces W1a, W2a and the interval between the wiring traces W2a, W1b in the direction parallel to the upper surface of the first insulating layer 41 was 20 μm.

(5-2) Comparative Example

Figure 6:
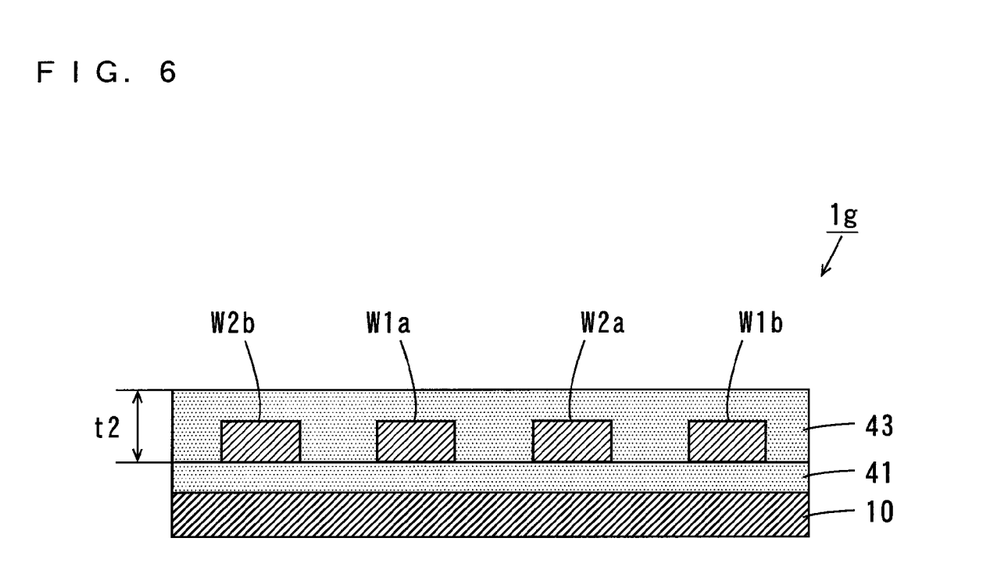
FIG. 6 is a schematic sectional view of a suspension board of a comparative example.

A suspension board shown in FIG. 6 was manufactured as the comparative example. FIG. 6 is a schematic sectional view of the suspension board of the comparative example. The suspension board 1g of FIG. 6 is different from the suspension board 1 of FIG. 2 in the following points.

In the suspension board 1g of FIG. 6, the wiring traces W1a, W2a, W1b, W2b were formed on the first insulating layer 41. The third insulating layer 43 was formed on the first insulating layer 41 to cover the wiring traces W1a, W2a, W1b, W2b.

Note that the thickness of each of the wiring traces W1a, W2a, W1b, W2b was 10 μm, and the width of each of the wiring traces W1a, W2a, W1b, W2b was 20 μm. The thickness of the first insulating layer 41 was 10 μm, and the thickness t2 (FIG. 6) of the third insulating layer 43 was 15 μm. Each of the interval between the wiring traces W2b, W1a, the interval between the wiring traces W1a, W2a and the interval between the wiring traces W2a, W1b in the direction parallel to the upper surface of the first insulating layer 41 was 20 μm.

(5-3) Evaluation of the Transmission Loss

Losses in differential mode input and differential mode output (Sdd21) for the suspension boards 1, 1g of the inventive example and the comparative example were calculated by simulation.

Figure 7:
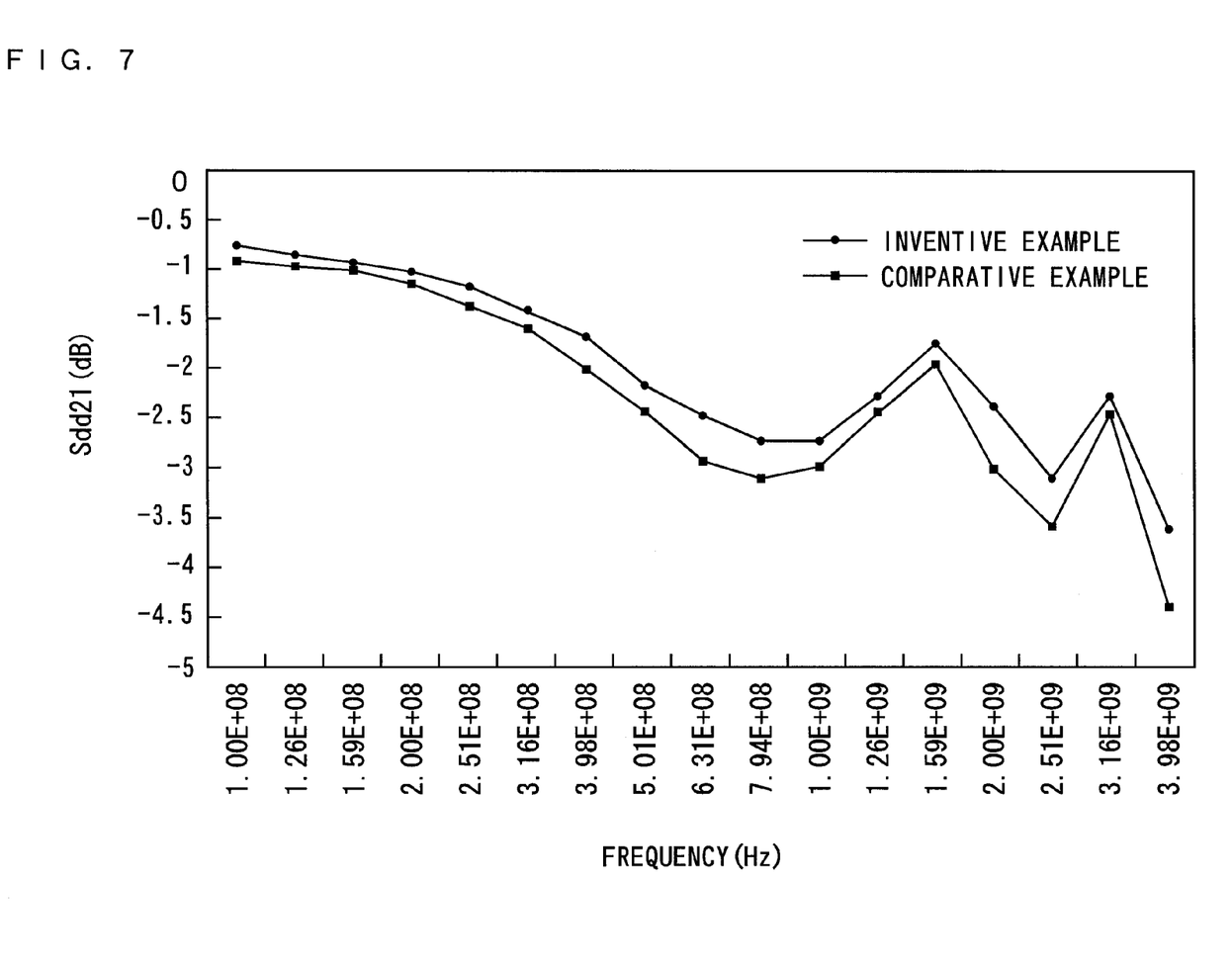
FIG. 7 is a diagram showing results of simulation of losses in a differential mode input and a differential mode output.

FIG. 7 is a diagram showing results of simulation of losses in the differential mode input and the differential mode output. In FIG. 7, the ordinate indicates a gain, and the abscissa indicates a frequency of a signal. Here, a negative gain represents the loss.

As shown in FIG. 7, the losses in the suspension board 1 of the inventive example were smaller than the losses in the suspension board 1g of the comparative example. The result shows that the wiring traces W1a, W2a are formed in the positions lower than the wiring traces W1b, W2b inside the wiring traces W1b, W2b, thus reducing the transmission loss.

(5-4) Evaluation of the Input/Output Elapsed Time

The input/output elapsed time at the time of input of the differential signal for the suspension boards 1, 1g of the inventive example and the comparative example was calculated by simulation. Note that the length of each of the wiring traces W1a, W2a, W1b, W2b of the suspension boards 1, 1g was 40 mm.

Figure 8:
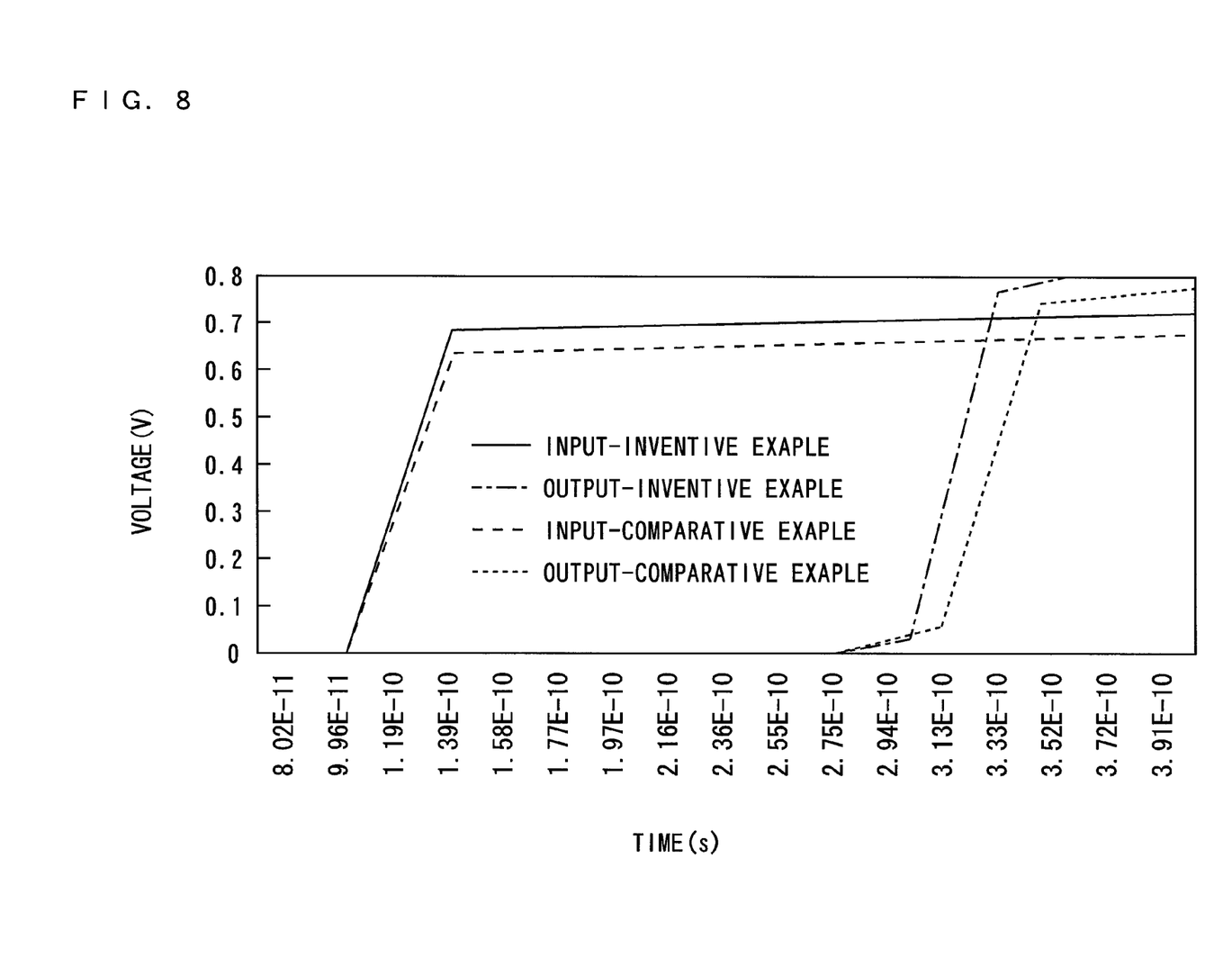
FIG. 8 is a diagram showing results of simulation of an input voltage and an output voltage at the time of input of a differential signal.

FIG. 8 is a diagram showing results of simulation of the input voltage and the output voltage of the wiring traces W1a, W2a, W1b, W2b at the time of input of the differential signal. In FIG. 8, the ordinate indicates voltage, and the abscissa indicates the elapsed time.

As shown in FIG. 8, the time period from the rise of the input voltage to the rise of the output voltage in the suspension board 1 of the inventive example was shorter than the time period from the rise of the input voltage to the rise of the output voltage in the suspension board 1g of the comparative example. The result shows that the wiring traces W1a, W2a are formed in the positions lower than the wiring traces W1b, W2b inside the wiring traces W1b, W2b, thus decreasing the input/output elapsed time at the time of input of the differential signal.

(6) Other Embodiments

While the present invention is applied to the suspension board that is used in an actuator of a hard disk drive in the foregoing embodiment, the present invention may be applied to another printed circuit board. Note that in this case, the suspension body 10 may not be provided.

While the write wiring patterns W1, W2 each include the plurality of wiring traces connected to one another in the foregoing embodiment, wiring traces constituting a pair or a plurality of pairs of signal lines may be provided separately from the write wiring patterns W1, W2.

(7) Correspondences Between Elements in the Claims and Parts in Embodiments

In the following paragraph, non-limiting examples of correspondences between various elements recited in the claims below and those described above with respect to various preferred embodiments of the present invention are explained.

In the foregoing embodiments, the first and second insulating layers 41, 42 are examples of an insulating layer, the wiring trace W1b is an example of a first wiring trace, the wiring trace W2b is an example of a second wiring trace, the wiring trace W2a is an example of a third wiring trace, and the wiring trace W1a is an example of a fourth wiring trace. The suspension body 10 is an example of a metal substrate, and the tongue 12 is an example of a head.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:
1. A printed circuit board comprising:
an insulating layer;
first and second wiring traces formed with a first height on said insulating layer; and third and fourth wiring traces formed with a second height different from said first height on said insulating layer inside said first and second wiring traces, wherein the first and third wiring traces are arranged to be adjacent to each other and constitute a first signal line pair, and the second and fourth wiring traces are arranged to be adjacent to each other and constitute a second signal line pair.

2. The printed circuit board according to claim 1, wherein an interval between said first and third wiring traces and an interval between said second and fourth wiring traces are equal to each other.

3. The printed circuit board according to claim 1, wherein one of said first and third wiring traces and one of said second and fourth wiring traces are connected to each other, and the other of said first and third wiring traces and the other of said second and fourth wiring traces are connected to each other.

4. The printed circuit board according to claim 1, wherein said first height is higher than said second height.

5. The printed circuit board according to claim 1, wherein said first height is lower than said second height.

6. The printed circuit board according to claim 1, further comprising:
   a long-sized metal substrate; and
   a head provided on said metal substrate for reading and writing signals, wherein
   said insulating layer is formed on said metal substrate, and
   said first, second, third and fourth wiring traces are electrically connected to said head.

7. A method of manufacturing a printed circuit board, comprising the steps of:
   forming first and second wiring traces with a first height on an insulating layer; and
   forming third and fourth wiring traces with a second height different from said first height on said insulating layer inside said first and second wiring traces, wherein
   the first and third wiring traces are arranged to be adjacent to each other and constitute a first signal line pair, and the second and fourth wiring traces are arranged to be adjacent to each other and constitute a second signal line pair.

* * * * *